US012477753B2

(12) United States Patent
Tung et al.

(10) Patent No.: US 12,477,753 B2
(45) Date of Patent: Nov. 18, 2025

(54) SEMICONDUCTOR DEVICE AND FABRICATING METHOD THEREOF

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 350 days.

(21) Appl. No.: 18/201,204

(22) Filed: May 24, 2023

(65) Prior Publication Data

US 2024/0234486 A1 Jul. 11, 2024

(30) Foreign Application Priority Data

Jan. 10, 2023 (CN) .......................... 202310035716.4
Jan. 10, 2023 (CN) .......................... 202320072771.6

(51) Int. Cl.
*H10D 1/00* (2025.01)
*H10B 12/00* (2023.01)
*H10D 1/68* (2025.01)

(52) U.S. Cl.
CPC ............ *H10D 1/042* (2025.01); *H10B 12/03* (2023.02); *H10D 1/696* (2025.01); *H10D 1/716* (2025.01)

(58) Field of Classification Search
CPC .......................... H10B 12/033; H10B 12/0335
See application file for complete search history.

(56) References Cited

U.S. PATENT DOCUMENTS

| 11,557,645 | B2 | 1/2023 | Tsai | |
|---|---|---|---|---|
| 11,818,880 | B2 | 11/2023 | Tung | |
| 12,048,138 | B2 | 7/2024 | Zhan | |
| 2007/0170487 | A1* | 7/2007 | Heitmann | H10B 12/033 |
| | | | | 438/399 |
| 2022/0085149 | A1* | 3/2022 | Zhu | H10B 12/02 |

FOREIGN PATENT DOCUMENTS

| CN | 109994449 | A | * | 7/2019 | ......... H01L 23/5283 |
|---|---|---|---|---|---|
| CN | 111108619 | A | * | 5/2020 | ............ H01G 4/018 |
| KR | 960001331 | B1 | * | 1/1996 | ......... H10B 12/0335 |
| KR | 20010087296 | A | * | 9/2001 | ......... H01L 1/76856 |
| KR | 20020015298 | A | * | 2/2002 | ......... H01L 1/02337 |
| KR | 20020031520 | A | * | 5/2002 | ........... H10B 12/482 |
| KR | 20180017902 | A | * | 2/2018 | ......... H01L 23/5226 |

* cited by examiner

*Primary Examiner* — Evren Seven
(74) *Attorney, Agent, or Firm* — Winston Hsu

(57) ABSTRACT

The present disclosure provides a semiconductor device and a fabricating method thereof, the semiconductor device includes a substrate, a capacitor structure, a sidewall high-k dielectric layer and a supporting structure. The capacitor structure is disposed on the substrate, and includes a plurality of columnar bottom electrodes, a capacitor dielectric layer and a top electrode layer, wherein each of the columnar bottom electrodes includes a recess on the top. The sidewall high-k dielectric layer is disposed on two opposite sidewalls of each of the columnar bottom electrodes, wherein a portion of the capacitor dielectric layer is filled in the recess and sandwiched between the columnar bottom electrodes and the sidewalls high-k dielectric layer. The supporting structure is disposed between the adjacent ones of the columnar bottom electrodes, and includes a first supporting layer and a second supporting layer stacked from bottom to top.

20 Claims, 10 Drawing Sheets

SEMICONDUCTOR DEVICE AND FABRICATING METHOD THEREOF

BACKGROUND OF THE INVENTION

1. Field of the Invention

The present disclosure relates to a semiconductor device and a fabricating method thereof, and more particularly, to a semiconductor memory device and a fabricating method thereof.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM only having planar gate structures under the current mainstream development trend. Generally, the DRAM having recessed gate structures is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL).

In order to satisfy the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

In order to achieve the above object, an embodiment of the present disclosure provides a fabricating method of a semiconductor device, in which a recess is formed on a columnar bottom electrode, and a capacitor dielectric formed subsequently will fill in the recess, to enhance the adhesion between the metal material (namely the columnar bottom electrode) and the dielectric material (namely the capacitor dielectric layer), and to reduce the possibility of the capacitor dielectric being pealing from the capacitor structure thereby. Then, the semiconductor device obtained accordingly may therefore obtain a more reliable and stable structure, to achieve better functions and performance.

In order to achieve the above object, an embodiment of the present disclosure provides a semiconductor device, where a recess is disposed on a columnar bottom electrode, and a capacitor dielectric layer is filled in the recess, so that, the adhesion between the metal material (namely the columnar bottom electrode) and the dielectric material (namely the capacitor dielectric layer) may be enhanced, to reduce the possibility of the capacitor dielectric being pealing from the capacitor structure thereby. Then, the semiconductor device may therefore obtain a more reliable and stable structure, to achieve better functions and performance.

To achieve the above object, one embodiment of the present disclosure provides a semiconductor device includes a substrate, a capacitor structure, a sidewall high-k dielectric layer and a supporting structure. The capacitor structure is disposed on the substrate, and includes a plurality of columnar bottom electrodes, a capacitor dielectric layer, and a top electrode layer, wherein each of the columnar bottom electrodes includes a recess on the top. The sidewall high-k dielectric layer is disposed on two opposite sidewalls of each of the columnar bottom electrodes, wherein a portion of the capacitor dielectric layer is filled in the recess and sandwiched between the columnar bottom electrodes and the sidewalls high-k dielectric layer. The supporting structure is disposed between the adjacent ones of the columnar bottom electrodes, and the supporting structure includes a first supporting layer and a second supporting layer stacked from bottom to top.

To achieve the above object, one embodiment of the present disclosure provides a fabricating method of a semiconductor device includes the following steps. Firstly, a substrate is provided, and a capacitor structure is formed on the substrate, wherein the capacitor structure includes a plurality of columnar bottom electrodes, a capacitor dielectric layer, and a top electrode layer, each of the columnar bottom electrodes includes a recess on the top. Next, a sidewall high-k dielectric layer is formed on two opposite sidewalls of each of the columnar bottom electrodes, wherein a portion of the capacitor dielectric layer is filled in the recess and sandwiched between the columnar bottom electrodes and the sidewalls high-k dielectric layer. Then, a supporting structure is formed between the adjacent ones of the columnar bottom electrodes, and the supporting structure includes a first supporting layer and a second supporting layer stacked from bottom to top.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 to FIG. 10 are schematic diagrams illustrating a fabricating method of a semiconductor device according to one embodiment in the present disclosure, wherein:

FIG. 1 shows a schematic cross-sectional view of a semiconductor device of the present disclosure after forming storage node pads;

FIG. 2 shows a schematic cross-sectional view of a semiconductor device of the present disclosure after forming a supporting layer structure;

FIG. 3 shows a schematic cross-sectional view of a semiconductor device of the present disclosure after forming a dielectric material layer;

FIG. 4 shows a schematic cross-sectional view of a semiconductor device of the present disclosure after forming a dielectric layer;

FIG. 5 shows a schematic cross-sectional view of a semiconductor device of the present disclosure after forming a bottom electrode layer;

FIG. 6 shows a schematic cross-sectional view of a semiconductor device of the present disclosure after forming mask patterns;

FIG. 7 shows a schematic cross-sectional view of a semiconductor device of the present disclosure after removing a third supporting material layer;

FIG. 8 shows a schematic cross-sectional view of a semiconductor device of the present disclosure after removing a first supporting material layer;

FIG. 9 shows a schematic cross-sectional view of a semiconductor device of the present disclosure after forming a capacitor dielectric layer; and FIG. 10 shows a schematic cross-sectional view of a semiconductor device of the present disclosure after forming a top electrode layer.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
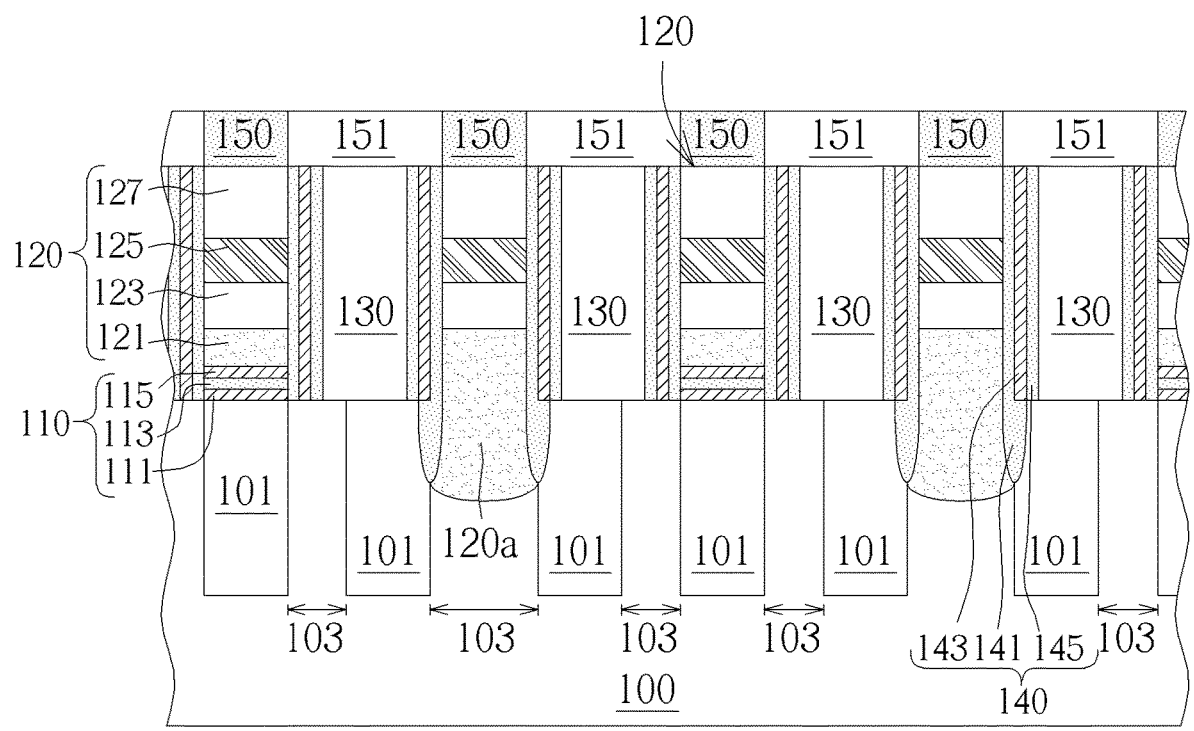

Referring to FIG. 1 to FIG. 10 which illustrate a fabricating method of a semiconductor device 300 in one embodiment of the present disclosure. Firstly, as shown in FIG. 1, a substrate 100 is provided, such as a silicon substrate, a silicon-containing substrate (like a SiC substrate or a SiGe substrate, etc.) or a silicon-on-insulator (SOI) substrate, and at least one insulating region such as a shallow trench isolation (STI) 101 is formed in the substrate 100, to define a plurality of active areas (AAs) 103 within the substrate 100. Accordingly, all of the active areas 103 are surrounded by the shallow trench isolation 101 as being viewed from a top view diagram (not shown in the drawings). In one embodiment, the formation of the shallow trench isolation 101 is accomplished by first forming a plurality of trenches (not shown in the drawings) in the substrate 100 through an etching process, and then filling the trenches with an insulating material (such as silicon oxide or silicon oxynitride), to form the shallow trench isolation 101 having a coplanar surface with the top surface of the substrate 100, but not limited thereto.

Next, a dielectric layer 110 is formed on the substrate 100, the dielectric layer 110 preferably includes a multilayer structure for example including an oxide-nitride-oxide (ONO) structure having an oxide layer 111-a nitride layer 113-an oxide layer 115, but not limited thereto. It is noted that, before forming the dielectric layer 110, a plurality of buried gates (not shown in the drawings) is formed in the substrate 100, and the dielectric layer 110 is then formed to cover on the top surfaces of the buried gates. The buried gates are extended parallel to each other in one direction (e.g., the X direction, not shown in the drawings), to serve as the buried word lines (BWL, not shown in the drawings) of the semiconductor device 300. On the other hand, a plurality of bit lines 120 and a plurality of plugs 130 are formed on the substrate 100, where the bit lines 120 are parallel extended along another direction (e.g., the Y direction, not shown in the drawings) being perpendicular to the said direction. Although the overall extending directions of the active areas 103, the buried gates and the bit lines 120 are not specifically depicted in the drawings of the present embodiment, it should be easily understood by those skilled in the art that the bit line 120 should be perpendicular to the buried gate and intersected with the active areas 103 and the buried gates at the same time as being viewed from a top view diagram (not shown in the drawings).

Precisely speaking, each of the bit lines 120 and each of the plugs 130 are alternately arranged along a specific direction, and each of the bit lines 120 includes a semiconductor layer (for example including polysilicon) 121, a barrier layer (for example including titanium and/or titanium nitride) 123, a conductive layer (for example including a low-resistance metal like tungsten, aluminum or copper) 125, and a capping layer (for example including silicon oxide, silicon nitride or silicon oxynitride) 127 stacked from bottom to top, but not limited thereto. Generally, all of the bit lines 120 are separately disposed on the dielectric layer 110, to intersect with the active areas 103, where the bit lines 120 across each active area 103 are further extended into each active area 103 via a bit line contact (BLC) 120a correspondingly formed below the bit lines 120, as shown in FIG. 1. In other words, the bit line contacts 120a and the semiconductor layer 121 of the bit lines 120 are monolithic in the present embodiment, to directly in contact with the corresponding active areas 103, but not limited thereto.

The plugs 130 are also separately disposed on the substrate 100, to directly contact the substrate 100 (including the active areas 103 and the shallow trench isolation 101) underneath, to serve to the storage node contacts (SNCs) of the semiconductor device 300, thereby receiving or transmitting the voltage signals from each memory cell unit. In one embodiment, the plugs 130 for example includes a low-resistance metal material, such as aluminum, titanium (Ti), copper or tungsten, and each of the plugs 130 and the bit lines 120 are insulated from each other by a spacer structure 140 therebetween. In one embodiment, the spacer structure 140 optionally includes a monolayer structure or a multilayer structure as shown in FIG. 1, for example includes but not limited to a first spacer 141 (for example including silicon nitride), a second spacer 143 (for example including silicon oxide) and a third spacer 145 (for example including silicon nitride) stacked in sequence on the sidewalls of each bit line 120.

Please also refer to FIG. 1, a dielectric layer 150 and a plurality of storage node pads (SN pads) 151 are further formed on the bit lines 120 and the plugs 130, with the dielectric layer 150 entirely covering the bit lines 120 and the plugs 130, and with the storage node pads 151 being separately disposed within the dielectric layer 150. Each of the storage node pads 151 includes a coplanar surface with the top surface of the dielectric layer 150, to respectively contact to each of the plugs 130 underneath, and to electrically connect thereto. In one embodiment, the storage node pads 151 also includes a low-resistance metal material such as aluminum, titanium, copper or tungsten, such as a metal material different from that of the plugs 130, and the dielectric layer 150 for example includes a dielectric material like silicon nitride, but is not limited thereto. In another embodiment, the storage node pads may be integrally formed with the plugs 130 to therefore include the same material.

Figure 2:
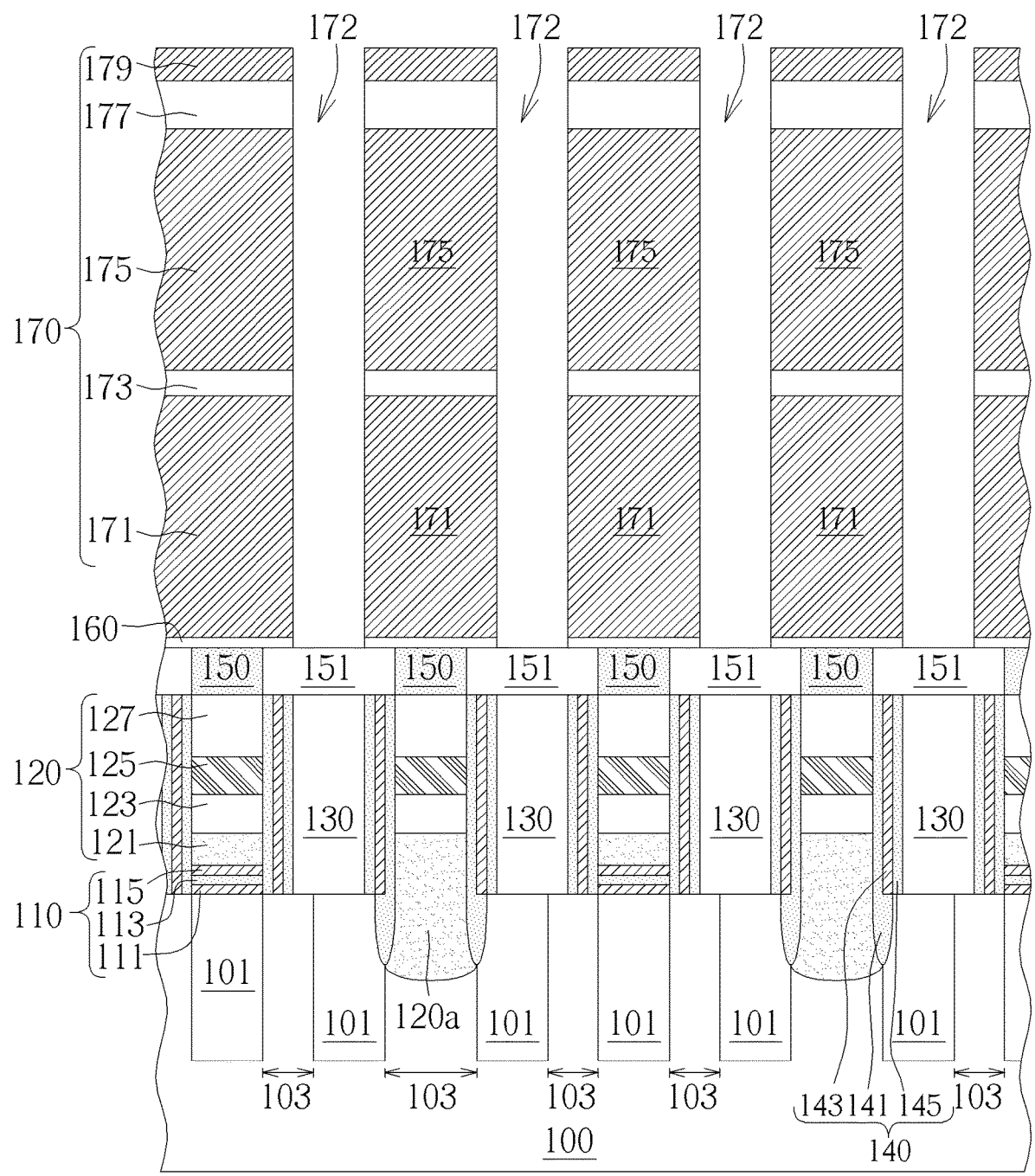

As shown in FIG. 2, an insulating layer 160 and a supporting layer structure 170 are sequentially formed on the dielectric layer 150, wherein the insulating layer 160 for example includes an insulating material like silicon oxide or silicon oxynitride, and the supporting layer structure 170 includes at least one oxide layer and at least one nitride layer stacked alternately. In the present embodiment, the supporting layer structure 170 includes for example a first supporting material layer 171 (for example including silicon oxide), a second supporting material layer 173 (for example including silicon nitride or silicon carbonitride), a third supporting material layer 175 (for example including silicon oxide), a fourth supporting material layer 177 (for example including silicon nitride or silicon carbonitride) and a fifth supporting material layer 179 (for example including silicon oxide) stacked in order from bottom to top, but not limited thereto. Then, a plurality through holes 172 is formed in the supporting layer structure 170 to sequentially penetrate through the fifth supporting material layer 179, the fourth supporting material layer 177, the third supporting material layer 175, the second supporting material layer 173, the first supporting material layer 171 and the insulating layer 160, to in align with the storage node pads 151 underneath respectively, so that, the top surface of each of the storage node pads 151 is therefore exposed from the through holes 172 respectively.

Preferably, the oxide layer (for example the first supporting material layer 171 or the third supporting material layer 175) have a relatively larger thickness, for example being about 5 times to more than 10 times of the thickness of the nitride layer (for example the second supporting material layer 173 or the fourth supporting material layer 177), and the thickness of the nitride layer (for example the fourth supporting material layer 177) located away from the substrate 100 is preferably greater than the thickness of the nitride layer (for example the second supporting material layer 173) located close to the substrate 100, as shown in FIG. 2, but not limited thereto. In the present embodiment, the overall thickness of the supporting layer structure 170 will reach about 1600 Å (angstroms) to about 2000 Å, but not limited thereto. It should be understood by those skilled in the art that the specific stacking numbers of the aforementioned oxide layers (such as the first supporting material layer 171, the third supporting material layer 175, or the fifth supporting material layer 179) and the aforementioned nitride layers (such as the second supporting material layer 173 or the fourth supporting material layer 177) are not limited to the aforementioned numbers, and which may be further adjusted according to the actual requirements, for example being four layers, five layers or other numbers of layers.

Figure 3:
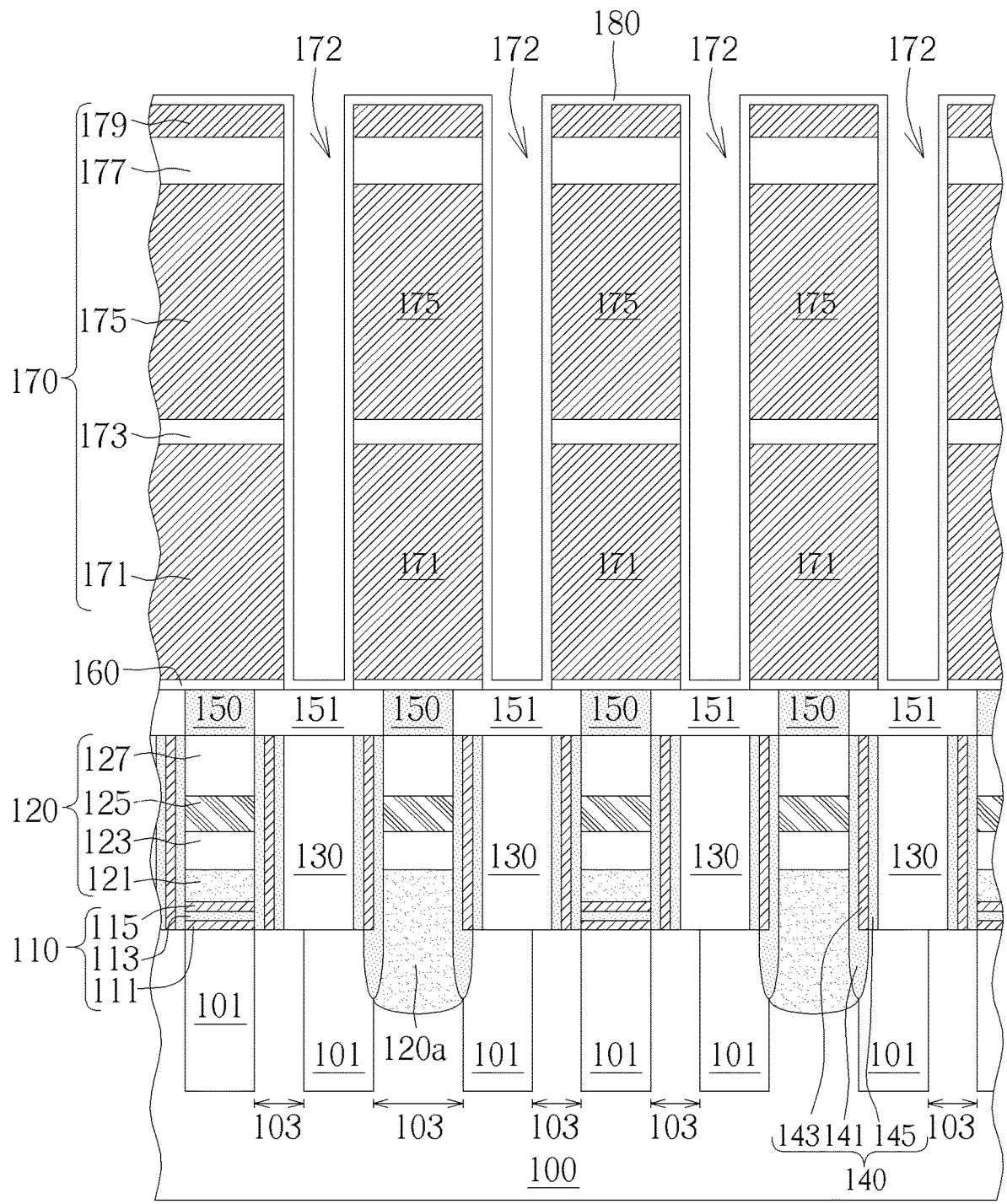

Next, as shown in FIG. 3, a deposition process is performed to form a dielectric material layer 180 on the supporting layer structure 170. Precisely speaking, the dielectric material layer 180 is conformally formed on the top surface of the supporting layer structure 170, and on the surfaces of the through holes 172 and the storage node pads 151, and the dielectric material layer 180 for example includes a dielectric material with a high dielectric constant (high-k dielectric material), like hafnium oxide ($HfO_2$), hafnium silicon oxide (HfSiO), hafnium silicon oxynitride (HfSiON), aluminum oxide ($Al_2O_3$), lanthanum oxide (LaO), lanthanum aluminum oxide (LaAlO), tantalum oxide ($Ta_2O_3$), titanium oxide ($TiO_2$), yttrium oxide ($Y_2O_3$), zirconium oxide ($ZrO_2$), zirconium silicon oxide ($ZrSiO_4$), hafnium zirconium oxide (HfZrO), strontium bismuth tantalate ($SrBi2Ta_2O_9$, SBT), lead zirconate titanate ($PbZr_xTiO_{1-x}O_3$, PZT), or barium strontium titanate ($Ba_xSr_{1-x}TiO_3$, BST), but not limited thereto.

Figure 4:
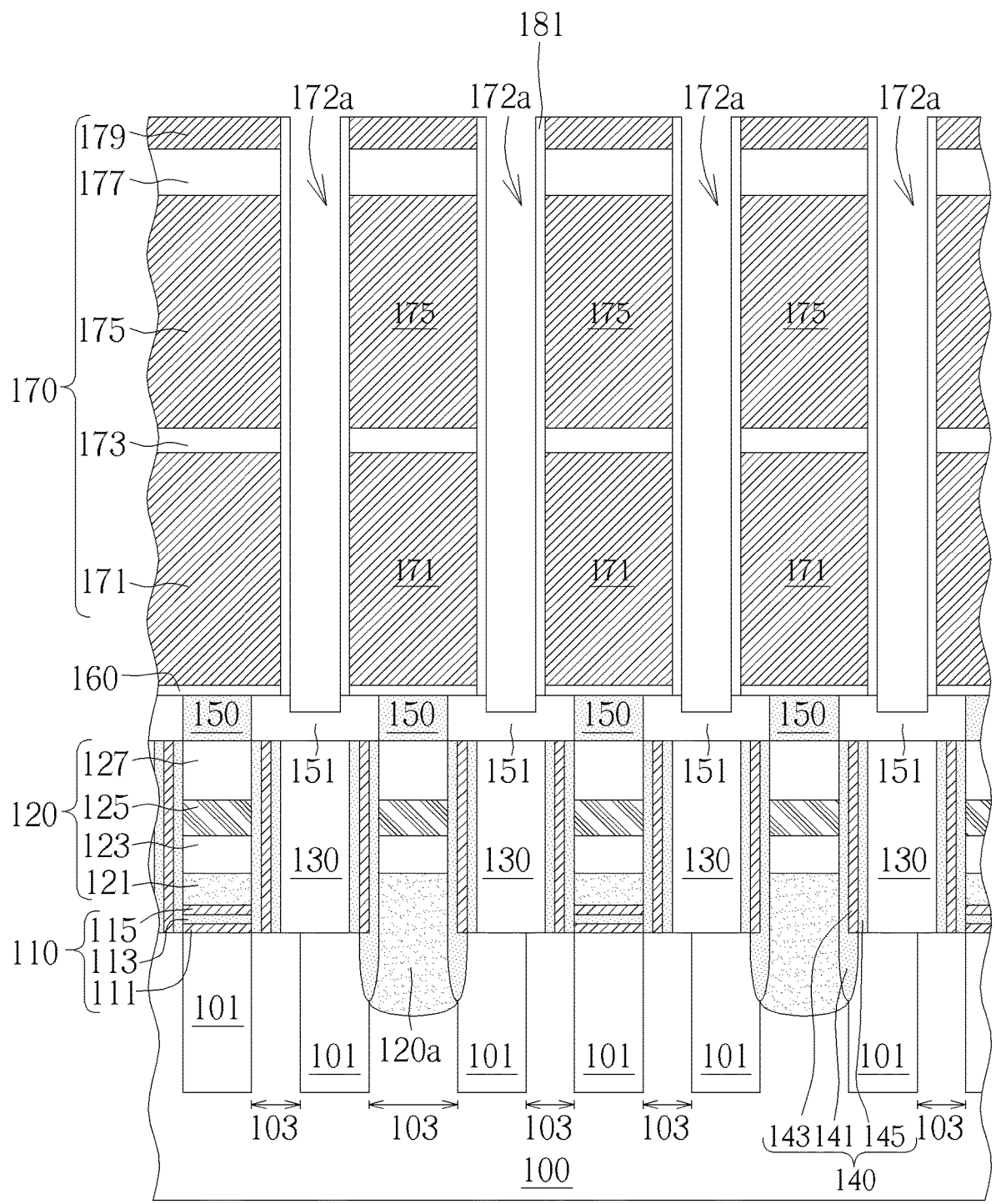

As shown in FIG. 4, an etching back process is performed on the dielectric material layer 180, to remove the dielectric material layer 180 covered on the top surface of the supporting layer structure 170 and on the surfaces of the storage node pads 151, and to remain the dielectric material layer 180 disposed on the sidewalls of the through holes 172. Thus, a plurality of sidewall high-k dielectric layers 181 is formed on opposite sidewalls of the through holes 172, thereby exposing the top surface of the storage node pads 151. Then, an etching process such as a dry etching process is performed through the coverage of the sidewall high-k dielectric layers 181, to downwardly etch a portion of the storage node pads 151 from the exposed top surfaces of the storage node pads 151, to form a plurality of openings 172*a* extended into the storage node pads 151 respectively.

Figure 5:
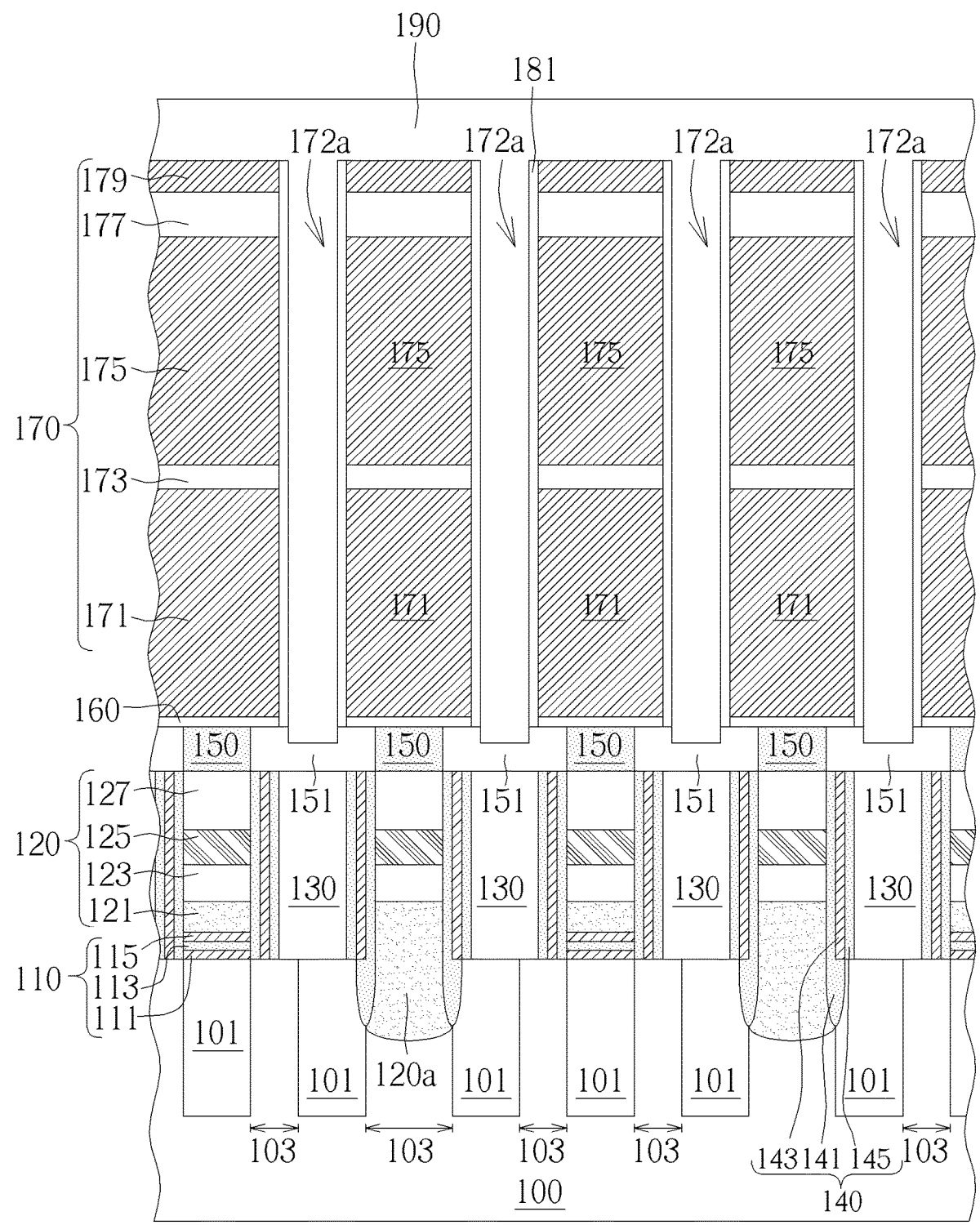
Figure 6:
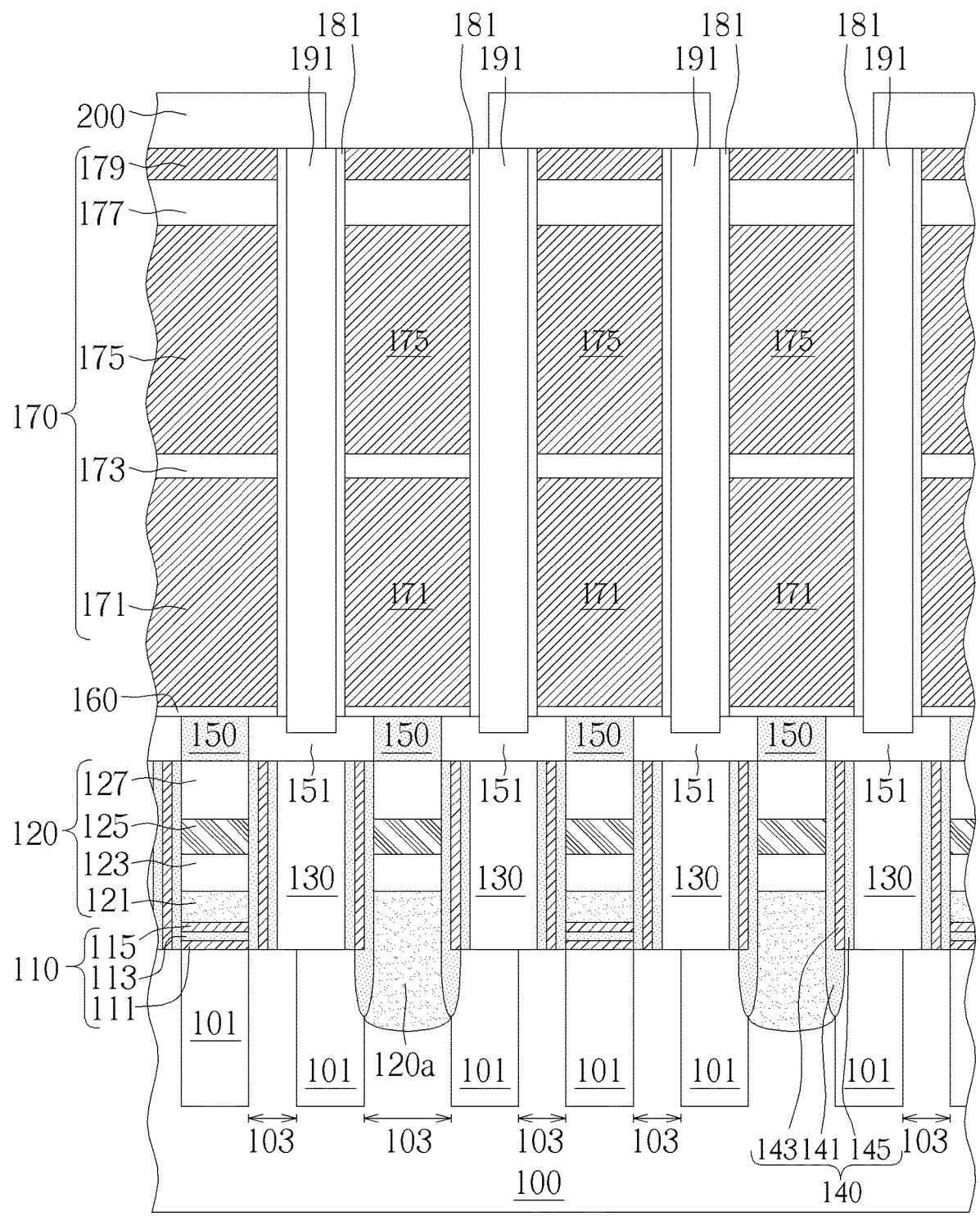

As shown in FIG. 5, a deposition process is performed to form a bottom electrode layer 190, to fill in the openings 172*a* and to further cover on the top surface of the supporting layer structure 170. In one embodiment, the bottom electrode layer 190 for example includes a low-resistance metal material, such as aluminum, titanium, copper or tungsten, and preferably includes titanium, but is not limited thereto. After that, another etching back process is performed to remove the bottom electrode layer 190 disposed on the top surface of the supporting layer structure 170, to form a plurality of columnar bottom electrodes 191 as shown in FIG. 6. Accordingly, each of the columnar bottom electrodes 191 may obtain a vertical columnar structure being left-right symmetrical. The bottom portions of the columnar bottom electrodes 191 are not coplanar with the bottom surfaces of the sidewall high-k dielectric layers 181, and which are further extended into the portions of the storage node pads 151, to increase the contact areas between the columnar bottom electrodes 191 and the storage node pads 151. The top surfaces of the columnar bottom electrodes 191 are coplanar with the top surfaces of the fifth supporting material layer 179 and the sidewall high-k dielectric layer 181.

As shown in FIG. 6, a plurality of mask patterns 200 is formed on the substrate 100, to cover a portion of the fifth supporting material layer 179 and a portion of the columnar bottom electrodes 191. Precisely speaking, each of the mask patterns 200 covers the top surface of the supporting layer structure 170 through a manner by simultaneously covering partial surfaces of two adjacent ones of the columnar bottom electrodes 191 and the top surface of the fifth supporting material layer 179 between the two adjacent ones of the columnar bottom electrodes 191, with about one-half to two-thirds of the top surfaces of the two adjacent ones of the columnar bottom electrodes 191 being covered by the mask pattern 200 to at least expose about one-third to one-half of the top surfaces, but not limited thereto.

Figure 7:
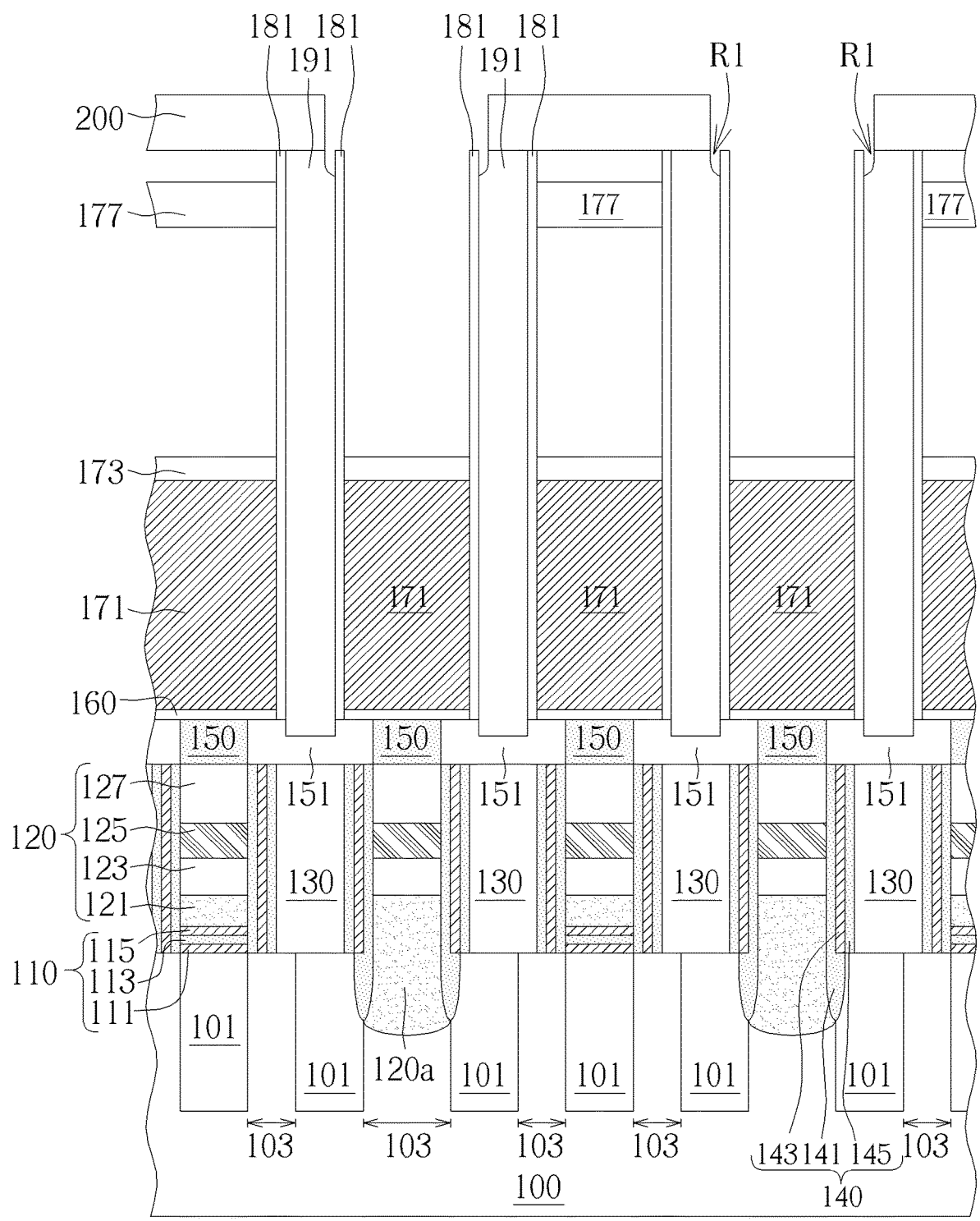

As shown in FIG. 7, at least one etching process is performed through the mask patterns 200, to partially remove the supporting layer structure 170. Precisely speaking, a first etching process such as a dry etching process is firstly performed, to downwardly etch a portion of the fifth supporting material layer 179 and the fourth supporting material layer 177 and the third supporting material layer 175 underneath through the surface of the fifth supporting material layer 179 being uncovered by the mask patterns 200, and a second etching process such as an isotropic wet etching process is then performed by introducing an etchant like tetramethylammonium hydroxide (TMAH), to laterally remove a rest portion of the fifth supporting material layer 179 and a rest portion of the third supporting material layer 175 of the supporting layer structure 170. Accordingly, the fifth supporting material layer 179 and the third supporting material layer 175 of the supporting layer structure 170 are completely removed thereby.

In addition, it is noted that while performing the at least one etching process, a portion of each of the columnar bottom electrodes 191 being not covered by the mask patterns 200 is further etched in the etching process, through adjusting the etching selectivity of the etching process, and the sidewall high-k dielectric layers 181 are not etched in the etching process. Through these performances, a recess R1 is formed on the top of each of the columnar bottom electrodes 191, being sandwiched between the sidewall high-k dielectric layer 181 and the unetched portion of the columnar bottom electrodes 191, wherein a bottommost surface of each recess R1 is higher than the top surface of the fourth supporting material layer 177, and is lower than the top surface of the sidewall high-k dielectric layer 181. In the present embodiment, due to the coverage of the mask patterns 200, the recesses R1 are only formed on one side of the top on each of the columnar bottom electrodes 191, so that, after forming the recesses R1, the top of each columnar bottom electrode 191 therefore becomes left-right asymmetrical. The side of each of the columnar bottom electrodes 191 having the recess R1 is not directly in contact with the supporting layer structure 170. Then, two adjacent ones of the columnar bottom electrodes 191 are mirror-symmetrical to each other, as shown in FIG. 7, which is beneficial on expanding the deposition space for a capacitor dielectric layer and a top electrode layer formed subsequently.

Figure 8:
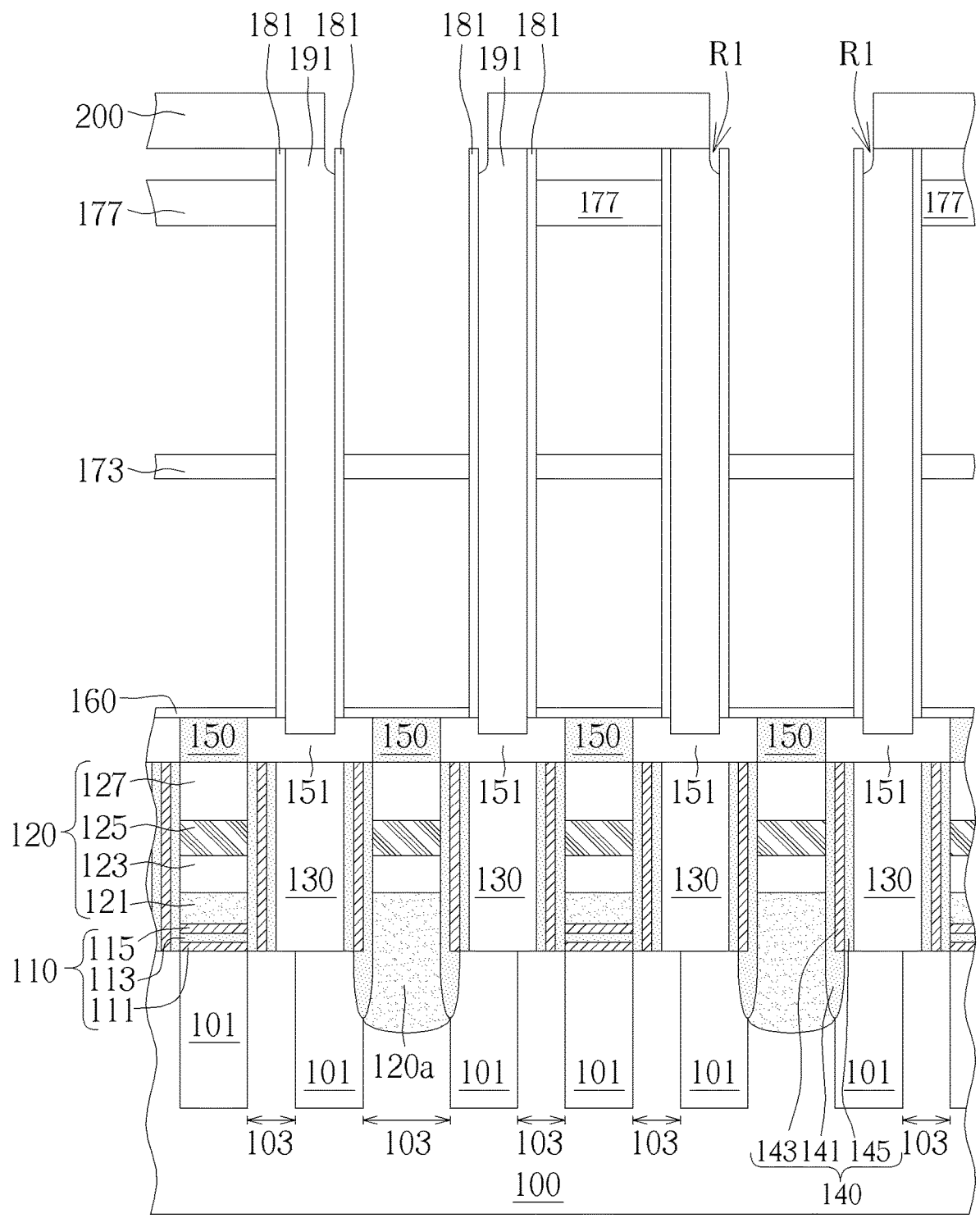

As shown in FIG. 8, a third etching process such as a dry etching process, and a fourth etching process such as an isotropic wet etching process are sequentially performed through the mask patterns 200, with the third etching process downwardly etching a portion of the second supporting material layer 179 and the first supporting material layer 171 underneath via the top surface of the second supporting material layer 173 being uncovered by the mask patterns, followed by etching a rest portion of the first supporting material layer 171 through the fourth etching process, by introducing an etchant like tetramethylammonium hydroxide.

It is noted that, while performing the third etching process and the fourth etching process, the etching selectivity thereof are adjusted preferably, without further etching the tops of the columnar bottom electrodes 191. Then, the bottommost surfaces of the recesses R1 are still being higher than the top surface of the fourth supporting material layer 177 and being lower than the top surface of the sidewall high-k dielectric layers 181, without further expanding the recesses R1. In another embodiment, the same etching selectivity as that of the aforementioned first etching process and the second etching process may also be used in the third etching process and the fourth etching process, to further etch the tops of the columnar bottom electrodes 191, thereby expanding the depth of the recesses R1. Then, the bottommost surface of each of the recesses may be reduced till being lower than the top surface of the fourth supporting material layer 177 in the another embodiment. On the other hand, since the sidewall high-k dielectric layers 181 are disposed on the sidewalls of each columnar bottom electrode 191, the sidewall high-k dielectric layers 181 will protect the columnar bottom electrodes 191 during the third etching process and the fourth etching process, with the sidewalls of the columnar bottom electrodes 191 being not affected by the third etching process and the fourth etching process.

Figure 9:
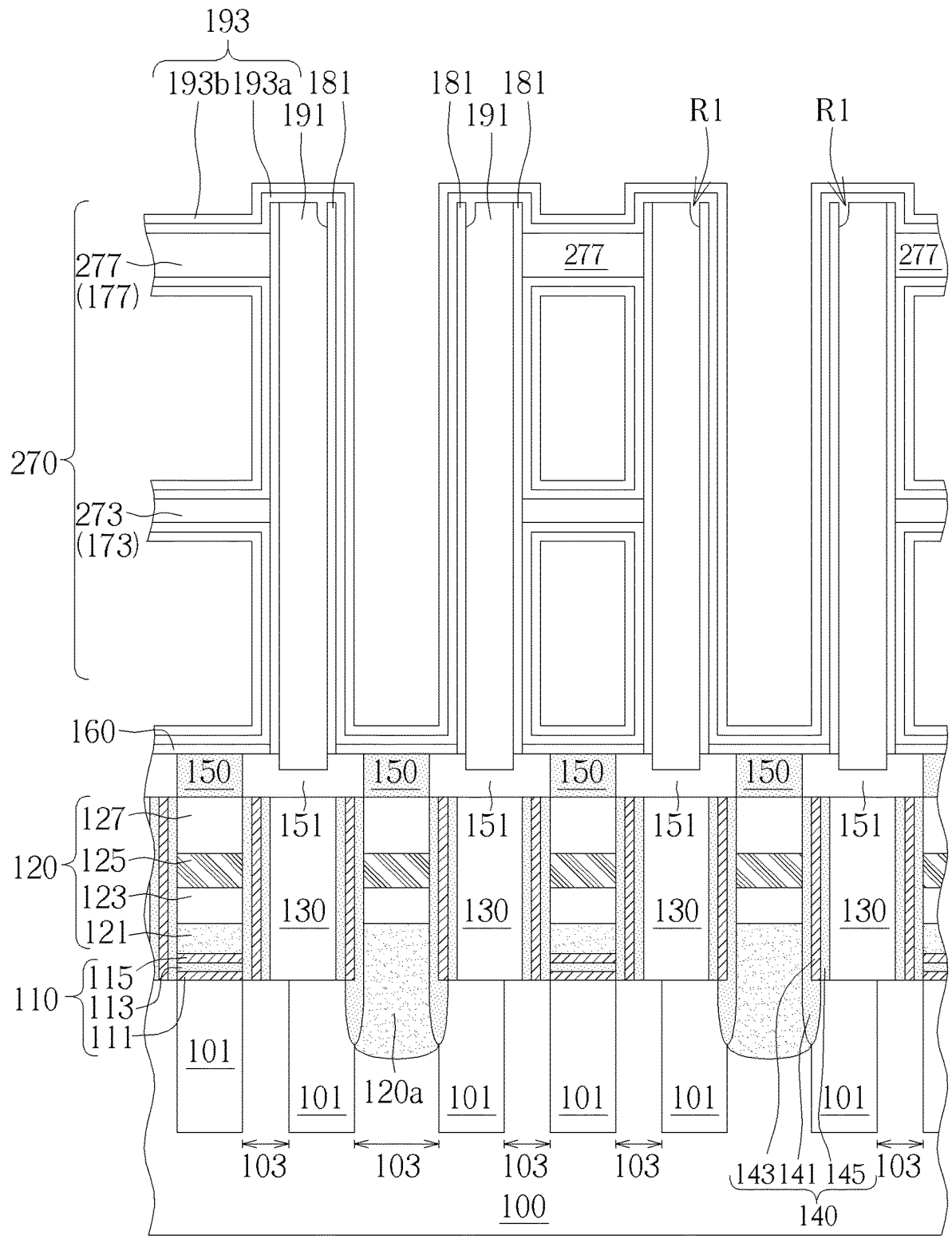

Following these, as shown in FIG. 9, the mask patterns 200 are completely removed, and the rest portion of the fourth supporting material layer 177 and the rest portion of the second supporting material layer 173 are respectively formed a second supporting layer 277 and a first supporting layer 273 disposed from top to bottom on at least one sidewall of each columnar bottom electrode 191. The second supporting layer 277 and the first supporting layer 273 together form a supporting structure 270 of the semiconductor device 300. Then, further in view of FIG. 9, at least one deposition process is performed on the supporting structure 270, to form a capacitor dielectric layer 193. Precisely speaking, the capacitor dielectric layer 193 includes a first dielectric layer 193a and a second dielectric layer 193b stacked sequentially, with both of the first dielectric layer 193a and the second dielectric layer 193b entirely covering all exposing surfaces of the supporting structure 270, the columnar bottom electrodes 191 and the sidewall high-k dielectric layers 181, and the first dielectric layer 193a further fills in the recesses R1. Accordingly, plural surfaces of the first supporting layer 273 and the second supporting layer 277 are respectively covered by the sidewall high-k dielectric layers 181 and the first dielectric layer 193a, and the first dielectric layer 193a disposed on the sidewalls of the columnar bottom electrodes 191 directly contact the sidewall high-k dielectric layers 181.

In the present embodiment, the first dielectric layer 193a and the second dielectric layer 193b respectively include different high-k dielectric materials, like hafnium oxide, hafnium silicon oxide, hafnium silicon oxynitride, aluminum oxide, lanthanum oxide, lanthanum aluminum oxide, tantalum oxide, titanium oxide, yttrium oxide, zirconium oxide, zirconium silicon oxide, hafnium zirconium oxide, strontium bismuth tantalate, lead zirconate titanate, or barium strontium titanate, but not limited thereto. Preferably, the first dielectric layer 193a includes a high-k dielectric material having a better attachment on the metal material, and both materials of the first dielectric layer 193a and the second dielectric layer 193b are different from that of the sidewall high-k dielectric layers 181, but not limited thereto.

Figure 10:
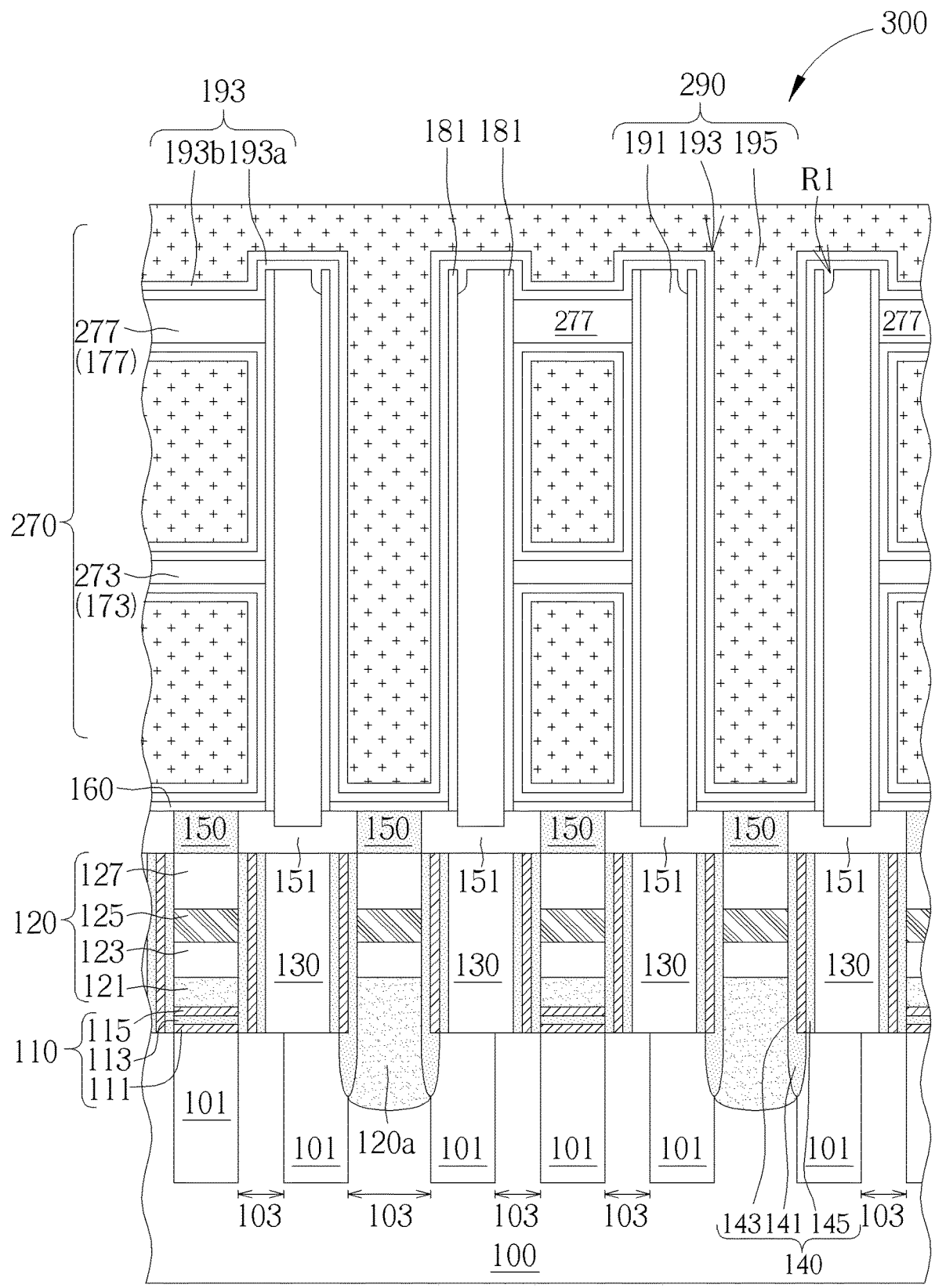

As shown in FIG. 10, another deposition process is performed on the capacitor dielectric layer 193, to form a top electrode layer 195, to fill in the spaces between the columnar bottom electrodes 191. Accordingly, the columnar bottom electrodes 191, the capacitor dielectric layer 193, and the top electrode layer 195 will together form a capacitor structure 290, wherein a portion of the top electrode layer 195 further fills between the second supporting layer 277 and the first supporting layer 273, and between the first supporting layer 273 and the insulating layer 160, to increase the contact areas thereby enhancing the capacitance value. In one embodiment, the top electrode layer 195 for example includes a low-resistance metal material, such as aluminum, titanium, copper, or tungsten, and preferably includes titanium, but is not limited thereto.

Then, the fabrication of the capacitor structure 290 is accomplished. The capacitor structure 290 includes a plurality of vertically extended capacitors, to serve as the storage nodes (SNs) of the semiconductor device 300, and the storage nodes are electrically connected to the transistors of the semiconductor device 300 through the storage node pads 151 and the storage node contacts (namely the plugs 130), thereby obtaining better connection between the capacitor structure 290 and the storage node contacts disposed on the substrate 100. With these arrangements, the semiconductor device 300 of the present embodiment may therefore form a DRAM device, where at least one transistor component and at least one capacitor form a smallest memory cell in the DRAM array to receive voltage signals from the bit line 120 and the buried word line.

According to the fabricating method of the present disclosure, the sidewall high-k dielectric layers 181 and the columnar bottom electrodes 191 are firstly formed in the through holes 172, with disposing the sidewall high-k dielectric layers 181 to protect the sidewalls of the columnar bottom electrodes 191 during the etching processes, and to enhance the adhesion between the columnar bottom electrodes 191 and the capacitor dielectric layer 193 formed in the subsequent process. Also, the high-k dielectric material of the sidewall high-k dielectric layers 181 further increase the capacitance value of the capacitor structure 290. On the other hands, the capacitor dielectric layer 193 fills in the recesses R1 on the tops of the columnar bottom electrodes 191, to further prevent from the pealing of the capacitor dielectric layer 193. Thus, in the fabricating method of the present disclosure, the deposition of the capacitor dielectric layer 193 and the top electrode layer 195 will be carried out more smoothly, to simplify the fabricating processes thereof. Meanwhile, the semiconductor device 300 obtained thereby may obtain a more stable and reliable structure, to achieve an optimized device efficiency.

Furthermore, while performing the first etching process, the columnar bottom electrodes 191 are optionally not covered by the mask patterns 200, to form the recesses R1 on the tops of two adjacent columnar bottom electrodes 191, with the two recesses R1 on the two adjacent columnar bottom electrodes 191 being arranged face-to-face or back-to-back. In this way, the two adjacent columnar bottom electrodes 191 are mirror-symmetric with each other, to effectively enlarge the deposition space of the subsequent forming capacitor dielectric layer 193. In other words, through the fabricating method of the present disclosure, the adhesion between the columnar bottom electrodes 191 and the capacitor dielectric layer 193 is strengthen by disposing the sidewall high-k dielectric layers 181 and the recesses R1, to reduce the possibility of the capacitor dielectric 193 being pealing from the capacitor structure 290. Then, the semiconductor device 300 may therefore obtain a more reliable and stable structure, to achieve better functions and performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a capacitor structure disposed on the substrate, the capacitor structure comprising a plurality of columnar bottom electrodes, a capacitor dielectric layer, and a top electrode layer, wherein each of the columnar bottom electrodes comprises a recess on a top thereof;
   a sidewall high-k dielectric layer, disposed on two opposite sidewalls of each of the columnar bottom electrodes, wherein a portion of the capacitor dielectric layer is filled in the recess and sandwiched between the columnar bottom electrodes and the sidewalls high-k dielectric layer; and
   a supporting structure, disposed between the adjacent ones of the columnar bottom electrodes, the supporting structure comprising a first supporting layer and a second supporting layer stacked from bottom to top.

2. The semiconductor device according to claim 1, wherein the capacitor dielectric layer comprises a first dielectric layer and a second dielectric layer stacked on one over another, the first dielectric layer fills in the recess.

3. The semiconductor device according to claim 2, wherein the first dielectric layer and the second dielectric layer respectively comprise different high-k dielectric materials.

4. The semiconductor device according to claim 2, wherein plural surfaces of the first supporting layer and the second supporting layer are covered by the first dielectric layer and the sidewall high-k dielectric layer.

5. The semiconductor device according to claim 1, further comprising:
   a plurality of storage node pads disposed on the substrate to contact to each of the columnar bottom electrodes respectively, wherein a portion of each of the columnar bottom electrodes extends into each of the storage node pads.

6. The semiconductor device according to claim 1, wherein a bottommost surface of the recess is higher than a top surface of the second supporting layer.

7. The semiconductor device according to claim 1, a side of each of the columnar bottom electrodes having the recess does not contact the supporting structure.

8. The semiconductor device according to claim 7, wherein two adjacent ones of the columnar bottom electrodes are mirror symmetric to each other.

9. A fabricating method of a semiconductor device, comprising:
   providing a substrate;
   forming a capacitor structure on the substrate, the capacitor structure comprising a plurality of columnar bottom electrodes, a capacitor dielectric layer, and a top electrode layer, wherein each of the columnar bottom electrodes comprises a recess on a top thereof;
   forming a sidewall high-k dielectric layer on two opposite sidewalls of each of the columnar bottom electrodes, wherein a portion of the capacitor dielectric layer is filled in the recess and sandwiched between the columnar bottom electrodes and the sidewalls high-k dielectric layer; and
   forming a supporting structure between the adjacent ones of the columnar bottom electrodes, the supporting structure comprising a first supporting layer and a second supporting layer stacked from bottom to top.

10. The method of fabricating the semiconductor device according to claim 9, further comprises:
    forming a first supporting material layer, a second supporting material layer, a third supporting material layer, a fourth supporting material layer and a fifth supporting material layer stacked in sequence on the substrate;
    forming a plurality of through holes penetrating through the fifth supporting material layer, the fourth supporting material layer, the third supporting material layer, the second supporting material layer and the first supporting material layer;
    forming a plurality of columnar bottom electrodes to fill in the through holes respectively;
    forming a plurality of mask patterns on the fifth supporting material layer;
    removing a portion of the fifth supporting material layer, a portion of the fourth supporting material layer and a portion of the third supporting material layer through the mask patterns;
    removing a portion of the second supporting material layer and a portion of the first supporting material layer through the mask patterns; and
    completely removing the mask patterns to form the supporting structure.

11. The method of fabricating the semiconductor device according to claim 10, further comprising:
    before removing the portion of the second supporting material layer and the portion of the first supporting material layer, etching the top of each of the columnar bottom electrodes to form the recess.

12. The method of fabricating the semiconductor device according to claim 10, further comprising:
performing a first wet etching process to remove a rest portion of the fifth supporting material layer and a rest portion of the third supporting material layer; and
performing a second wet etching process to remove a rest portion of the first supporting material layer.

13. The method of fabricating the semiconductor device according to claim 12, wherein the first wet etching process and the second wet etching process are performed before completely removing the mask patterns.

14. The method of fabricating the semiconductor device according to claim 10, wherein the sidewall high-k dielectric layers are formed on two opposite sidewalls of each of the through holes before forming the columnar bottom electrodes.

15. The method of fabricating the semiconductor device according to claim 14, further comprising:
forming a dielectric material layer, covering surfaces of the through holes and the fifth supporting material layer;
performing a first etching back process, to partially remove the dielectric material layer, to form the sidewall high-k dielectric layer;
forming a bottom electrode layer to fill in the through holes and to cover the surfaces of the fifth supporting material layer; and
performing a second etching back process, to partially remove the bottom electrode layer, to form the columnar bottom electrodes.

16. The method of fabricating the semiconductor device according to claim 14, further comprising:
forming a plurality of storage node pads on the substrate, to expose top surfaces of the storage node pads from the through holes;
after forming the sidewall high-k dielectric layer, etching the storage node pads through each of the through holes; and
forming the columnar bottom electrodes in the through holes, wherein a portion of each of the columnar bottom electrodes extends into each of the storage node pads.

17. The method of fabricating the semiconductor device according to claim 10, further comprising:
after forming the supporting structure, forming the capacitor dielectric layer and the top electrode layer.

18. The method of fabricating the semiconductor device according to claim 17, forming the capacitor dielectric layer further comprising:
forming a first dielectric layer on the supporting structure and the columnar bottom electrodes, the first dielectric layer filled in the recess; and
forming a second dielectric layer on the first dielectric layer.

19. The method of fabricating the semiconductor device according to claim 18, wherein plural surfaces of the first supporting layer and the second supporting layer are covered by the first dielectric layer and the second dielectric layer.

20. The method of fabricating the semiconductor device according to claim 9, wherein a bottommost surface of the recess is higher than a top surface of the second supporting layer.

* * * * *